(12) United States Patent
Volrath et al.

(10) Patent No.: US 6,404,250 B1
(45) Date of Patent: Jun. 11, 2002

(54) ON-CHIP CIRCUITS FOR HIGH SPEED MEMORY TESTING WITH A SLOW MEMORY TESTER

(75) Inventors: Joerg Volrath; Keith White, both of Richmond; Mark Eubanks, Mechanicsville, all of VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 0 days.

(21) Appl. No.: 09/819,588

(22) Filed: Mar. 28, 2001

(51) Int. Cl.[7] .............................................. H03L 7/00
(52) U.S. Cl. ...................................... 327/160; 365/235
(58) Field of Search ................................ 327/141, 142, 327/144, 147, 151, 156, 160, 201; 375/376, 213, 215, 294; 377/84, 110; 365/174, 201, 233, 233.5, 236

(56) References Cited

U.S. PATENT DOCUMENTS

| 5,463,337 A | 10/1995 | Leonowich | .................. 327/158 |
|---|---|---|---|
| 5,850,415 A | * 12/1998 | Hunsinger et al. | .......... 375/216 |
| 5,994,938 A | * 11/1999 | Lesmeister | .................. 327/277 |

* cited by examiner

Primary Examiner—My-Trang Nu Ton
(74) Attorney, Agent, or Firm—Irwin Ostroff; Erwin Pfeifle

(57) ABSTRACT

A memory system on a semiconductor body is tested by testing components formed on the semiconductor body. A programmable clock signal generator receives an external clock signal and selectively generates an output clock signal having a frequency at a predetermined multiple of the received external clock signal. A counter receives the output clock signal from the clock signal generator and generates output signals having a cyclical binary count up to the predetermined multiple of the received external clock signal. Memory locations in a programmable look-up memory store separate commands for testing the memory system. The programmable look-up memory receives each of selective remotely generated binary encoded address signals to access a separate predetermined look-up memory section, and the binary output signals from the counter for sequentially accessing separate memory locations within the separate predetermined look-up memory section.

16 Claims, 2 Drawing Sheets

SPECIAL TEST MODE COMMANDS

| COMMAND GROUP | COMMANDS |
|---|---|
| ACT | (ACTA, ACTB, ACTC, ACTD) |
| NOP | |
| DESL | |
| PRE | (PREall, NOP, NOP, NOP) |
| RD | Burst RD (4), |
| WR | Burst WR (4) |
| REFR | REFER, NOP, NOP, NOP |
| MRS | |

(rows labeled 30–37)

FIG. 2

ON-CHIP CIRCUITS FOR HIGH SPEED MEMORY TESTING WITH A SLOW MEMORY TESTER

FIELD OF THE INVENTION

The present invention relates to on-chip circuits that permit high speed testing of memory of, for example, a Synchronous Dynamic Random Access Memory (SDRAM) or a Rambus dynamic memory using a currently available external memory tester operating at a speed slower than the higher operating speeds of the SDRAMs.

BACKGROUND OF THE INVENTION

In the manufacturing of a new Dynamic Random Access Memory (DRAM) chips, a DRAM chip is generally subjected to various tests to ensure proper operation thereof when subsequently used. In the prior art, DRAM chips are tested with a memory tester and/or burn-in (BI) oven which are readily available from various vendors and are well-known in the art. In a burn-in test, the DRAM chip is heated in an oven so that the chip and it components may be subjected to stress to detect any possible failures that could occur during normal operating conditions. It may be found that during a burn-in test, internal voltages may be altered to follow any rise in an applied external voltage. Such new DRAM chips such as, for example, a Synchronous Dynamic Random Access Memory (SDRAM) or a Rambus dynamic memory, have high speed interface having speeds of 100 MHz to 1 GHz. The problem with the prior art testing apparatus is that the current memory testers and Burn-In ovens can only deliver test speeds of from 5 MHz to 200 MHz which only covers a small portion of the lower speeds used by the new DRAMs.

It is desirable to provide testing apparatus that at least covers the gap between the speeds found with the new DRAMs and the currently available test equipment so that the DRAMs can be tested at their maximum speeds.

SUMMARY OF THE INVENTION

The present invention is directed to on-chip circuits that permit high speed testing of memories on, for example, a Synchronous Dynamic Random Access Memory (SDRAM) chip or a Rambus dynamic memory chip using a currently available external memory tester operating at a speed slower than the higher operating speeds of the SDRAMs.

Viewed from a first apparatus aspect, the present invention a semiconductor body comprising a first portion comprising a memory system, and a second portion comprising a programmable clock and test command signal generator. The programmable clock and test command signal generator comprises a programmable clock signal generator, a counter, and a programmable look-up memory. The programmable clock signal generator comprises a clock input terminal and an output terminal, and is designed to generate at the output terminal thereof a clock output signal having a frequency which is a selective predetermined multiple of an external clock signal applied to the clock input terminal. The counter has an input coupled to the output terminal of the programmable clock signal generator and at least one output terminal. The counter is designed to generate at the at least one output terminal thereof a cyclical binary count comprising a number of counts corresponding to the multiple of the frequency of the external clock output signal generated by the programmable clock signal generator. The programmable look-up memory comprises memory locations for storing separate commands useful for testing predetermined sections of the memory system. The programmable look-up memory further comprises (a) at least one first input terminal coupled to receive the cyclical binary count from the counter, (b) a plurality of second input terminals coupled to receive remotely generated encoded binary address input signals which are combined with the binary count from the counter to access predetermined memory locations in the look-up memory, and (c) at least one output terminal coupled to predetermined inputs of the memory system such that testing of the memory system is accomplished at the speed of the output clock signal from the programmable clock signal generator.

Viewed from a second apparatus aspect, the present invention is a memory chip comprising a first portion comprising a memory system, and a second portion comprising a programmable clock and test command signal generator. The programmable clock and test command signal generator comprises a programmable delay locked loop (DLL), a counter, and a programmable look-up memory. The programmable delay locked loop (DLL) comprises a clock input terminal and an output terminal. The DLL is designed to generate at the output terminal thereof a clock output signal having a frequency which is a selective predetermined multiple of an external clock signal applied to the clock input terminal. The counter has an input coupled to the output terminal of the DLL and at least one output terminal. The counter is designed to generate, at the at least one output terminal thereof, a cyclical binary count comprising a number of counts corresponding to the multiple of the frequency of the external clock output signal generated by the DLL. The programmable look-up memory comprises a plurality of memory locations for storing separate commands useful for testing predetermined sections of the memory system. The programmable look-up memory comprises (a) at least one first input terminal coupled to receive the cyclical binary count from the counter, (b) a plurality of second input terminals coupled to receive remotely generated encoded binary address input signals which are combined with the binary count from the counter to access predetermined memory locations in the look-up memory, and (c) at least one output terminal coupled to predetermined inputs of the memory system such that testing of the memory system is accomplished at the speed of the output clock signal from the DLL.

Viewed from a method aspect, the present invention is a method of testing a semiconductor body having a memory system in a first portion thereof, and a programmable clock and test command signal generator in a second portion thereof. With the method, an output clock signal is selectively generated at an output of a programmable clock signal generator in the programmable clock and test command signal generator having a frequency which is a predetermined multiple of a received external clock signal at an input of the programmable clock signal generator. An output signal is generated at an output of a counter comprising a cyclical binary count comprising a number of counts corresponding to the predetermined multiple of the received external clock signal selectively generated by the programmable clock signal generator in response to the output clock signal received at an input from the programmable clock signal generator. Separate commands for testing the memory system are stored in a programmable look-up memory comprising a plurality of memory locations. The plurality of memory locations in the programmable look-up memory are addressed with each of (1) selective external binary encoded address signals received at a plurality of first input terminals thereof where each separate binary encoded external address signal is used for accessing a separate predetermined section of the memory locations, and (2) output signal from the counter receiver at at least one second input terminals for sequentially accessing separate memory locations within the addressed separate predetermined section of memory locations at the speed of the output clock signal from the programmable clock signal generator.

The invention will be better understood from the following more detailed description taken with the accompanying drawings and claims.

BRIEF DESCRIPTION OF THE DRAWING

FIG. 2 shows an exemplary sequence of special test mode commands for an SDRAM of FIG. 1 for a case where the counter outputs a two-bit binary address.

DETAILED DESCRIPTION OF THE INVENTION

Figure 1:
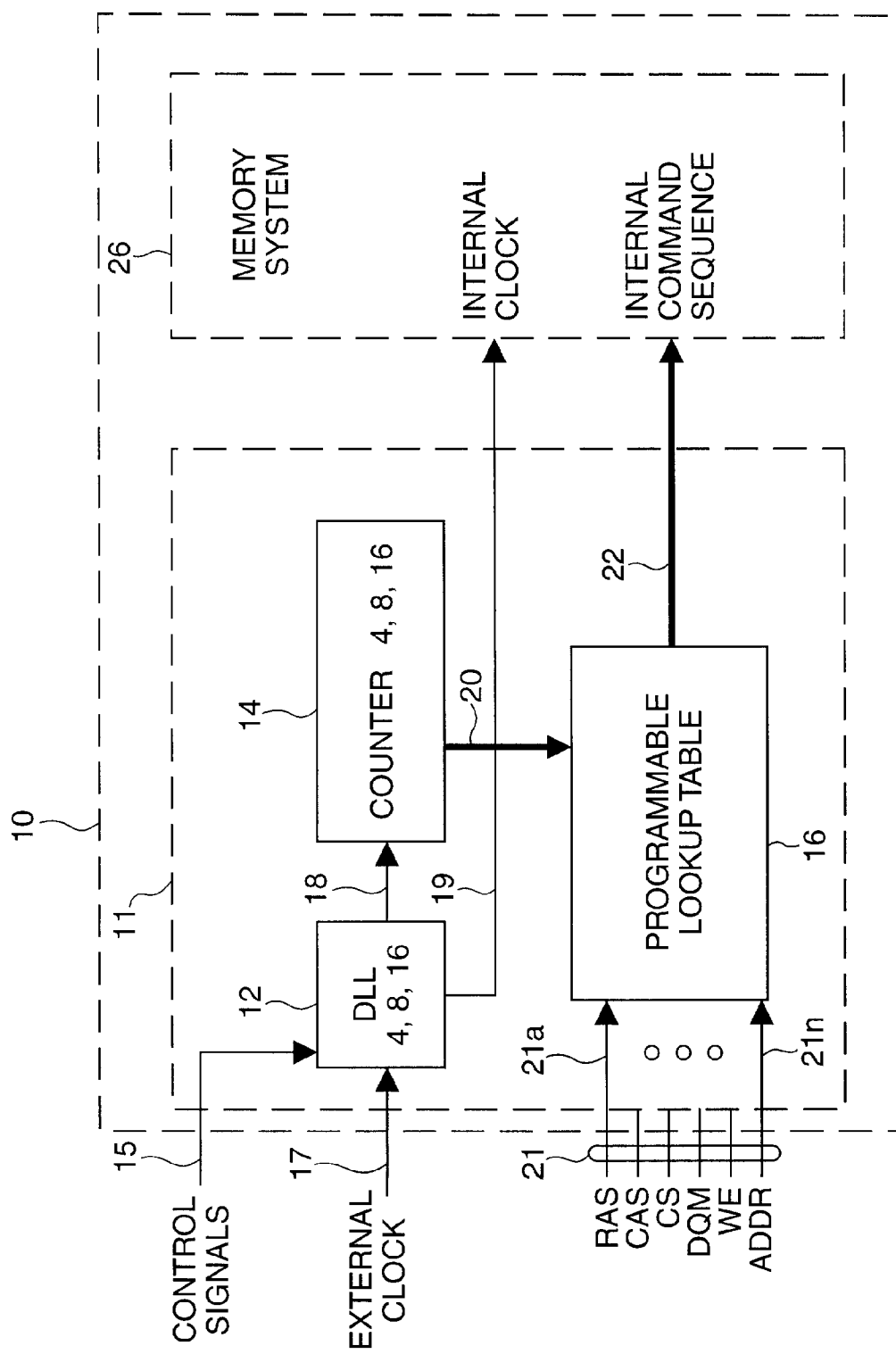
FIG. 1 shows a block diagram of a pertinent portion of a Synchronous Dynamic Random Access Memory (SDRAM) chip in accordance with the present invention.

Referring now to FIG. 1, there is shown a block diagram of a memory chip 10 (shown within a dashed line rectangle) comprising a programmable clock and test command signal generator 11 (shown within a dashed line rectangle), and a memory system 26 (shown within a dashed line rectangle) in accordance with the present invention. The memory chip 10 can have the form of, for example, a Synchronous Dynamic Random Access Memory (SDRAM), a Dynamic Random Access Memory (DRAM), a Static Random Access Memory (SRAM), or any other such type of memory chip 10 that requires testing to ensure proper operation thereof. The memory chip 10 has its components typically formed on a semiconductor body (not shown) comprising any known compound such as, for example, silicon, gallium arsenide, or any other suitable compound. The semiconductor body may comprise a p-type or n-type substrate with the required components formed in and/or thereon. The memory chip 10 can also be formed on a silicon on sapphire substrate or a silicon on insulator substrate.

The memory system 26 is defined hereinafter as comprising all of the memory cells and peripheral control circuits normally found on an SDRAM, DRAM, or SRAM. Typical peripheral circuits formed on a memory chip 10 are, for example, a plurality of memory modules (not shown) and their associated transmission lines and connectors (not shown), and a generator system (not shown) for generating required voltages to the various circuits on the memory chip 10 during testing and normal operation of the memory chip 10 as are well known in the art.

In accordance with the present invention, the programmable clock and test command signal generator 11 comprises a Programmable Delay Locked Loop 12 (DLL 4, 8, 16), a step counter 14 (COUNTER 4, 8, 16) for counting binary values of 4, 8, and/or 16, and a Programmable Look-up Table (or Memory) 16. It is to be understood that the values of 4, 8, and 16 shown for the DLL 12 and the counter 14 are exemplary values only and that other values such as 32 and 64 could also be used if desired. The DLL 12 is a programmable DLL that is selectively arranged to generate an output clock signal that comprises any predetermined one of a multiple (e.g., 4, 8, or 16) of the received external clock signal based on predetermined input control signals provided via one or more leads 15.

In operation of the programmable clock and test command signal generator 11, the DLL 12 receives an external clock signal via a lead 17 and generates an output clock signal on a lead 18 which is a desired multiple (e.g., 4, 8, or 16) of the received external clock signal dependent on the control signal provided via lead 15. For example, the external clock signal on lead 17 can have a frequency of, for example, between 1 MHz to 200 MHz, and for a desired output clock signal of four times (4×) the received external clock signal, the DLL 12 is arranged to generate a predetermined output clock frequency between 4 MHz to 800 MHz on lead 18. In a similar manner, for a desired output clock signal of eight times (8×) the received external clock signal, the DLL 12 is arranged to generate a predetermined frequency between 8 MHz to 1600 MHz on lead 18, and for a desired output clock signal of sixteen times (16×) the received external clock signal, the DLL 12 is arranged to generate a predetermined frequency between 16 MHz to 3200 MHz on lead 18. A corresponding resultant output clock signal from the DLL 12 is also provided as an internal clock signal via a lead 19 to peripheral circuits in the memory system 26 requiring such clock signal. The DLL 12 is a circuit that is well known in the art, and the DLL 12 can comprise any suitable programmable clock signal generating device known in the art. A typical prior art example of a Delay Lock Loop for generating various multiple frequencies of an input clock reference signal is disclosed, for example, in U.S. Pat. No. 5,463,337, (Leonowich), entitled "Delay Locked Loop Based Clock Synthesizer Using A Dynamically Adjustable Number Of Delay Elements Therein", issued on Oct. 31, 1995.

The Counter 14 receives the output clock signal from the DLL 12 via the lead 18 and generates therefrom a cyclical output binary count on leads or bus 20 (shown as a bold line) at a rate corresponding to the pulse rate of the output clock signal generated by the DLL 12. For an output clock signal generated by the DLL 12 of four times (4×) the received external clock signal via lead 17, a two-bit counter is all that is necessary to provide a 4× count. More particularly, for a 4× count, the two-bit counter 14 cyclically counts in binary from 0–3 (00, 01, 10, 11) at the pulse rate of the clock signal received via lead 18. Concurrently, the counter 14 transmits the current binary count (e.g., 00) as corresponding control binary address output signals to the Programmable Look-up Table 16 via a pair of leads or bus 20 (shown as a bold line). Similarly, for an output clock signal generated by the DLL 12 of eight times (8×) the received external clock signal via lead 17, a three-bit counter 14 is all that is necessary to provide the 8× count. For an 8× count, the three-bit counter 14 cyclically counts in binary from 0–7 (000, 001, 010, 011, 100, 101, 110, and 111) at the pulse rate of the clock signal received via lead 18. Concurrently, the counter 14 transmits the current binary count (e.g., 000) as corresponding control binary address output signals to the Programmable Look-up Table 16 via three leads or bus 20 (shown as a bold line). Similarly, for a 16× count, a four-bit counter 14 is all that is necessary to provide the 16× count, and the counter 14 transmits the current binary count (e.g., 0000) as corresponding control binary address output signals to the Programmable Look-up Table 16 via four leads 20 (shown as a bold line). The control binary address output signals on leads or bus 20 form part of the address of memory locations in the Programmable Look-up Table 16. The remaining part of the address is obtained from various leads (RAS, CAS, CD, DQM, WE, ADDR) which are provided to the Programmable Look-up Table 16 via bus or cable 21 and the leads 21a–21n from, for example, an external tester (not shown).

The Programmable Look-up Table 16 stores commands for testing predetermined circuits (not shown) in the memory system 26, and when a memory location is accessed, the command stored therein is transmitted over a bus 22 to a desired peripheral circuit (not shown) in the memory system 26. A particular command sequence for testing the memory system 26 is stored in sequential addresses in the Programmable Look-up Table 16. The binary address control output signal (0, 1) from each of the RAS, CAS, CS, DQM, WE, and ADDR leads 21a–21n, respectively, via the cable 21 forms the most significant bits for a part of an address for a predetermined set or group of test commands. The least significant bits of the address are provided by the binary address output signals from the counter 14 via leads or bus 20. For example, for a 4× count by the counter 14, the least significant bits of the address are two binary bits which sequences through 4 commands (0–3) in a predetermined set or group of commands addressed via the cable 21. This is explained in greater detail hereinbelow in association with FIG. 2. Similarly, for a 8× count by the counter 14, the least significant bits of the addresses are three binary bits which would sequence through 8 possible commands (0–7) in a predetermined set of commands addressed via the cable 21. Similarly, for a 16× count by the counter 14, the least significant bits of the addresses are four binary bits which would sequence through 16 possible commands (0–15) in the predetermined set or group of commands addressed via the cable 21.

Referring now to FIG. 2, there is shown an exemplary sequence of special test mode commands for testing the memory system 26 on an SDRAM 10 for a case where the counter 14 outputs a two-bit binary address (0–3) on leads or bus 20. The commands shown in FIG. 2 are known SDRAM commands that are listed in available SDRAM data sheets which indicate their meaning and use. In the operation of the SDRAM 10 of FIG. 1 in accordance with the present invention, the most significant bits of the address produced by the RAS, CAS, CS, DQM, WE, and ADDR address control signals obtained via cable 21 are used to access a predetermined one of the group of memory locations 30–37 in the Programmable Look-up Table 16. For example, the RAS lead 21a provides a binary signal (0 or 1) representing a Row Address Select, the CAS provides a binary signal (0 or 1) representing a Column Address Select, etc. Concurrently added thereto as the least significant bits of the address portion produced by the two-bit counter 14 via leads or bus 20 is the current two bit binary number (00, 01, 10, or 11). When, for example, the ACT (Activate) command group 30 is accessed by the address control signals via cable 21, the first count from the counter 14 is a binary 00 which causes the ACTA command to be read and transmitted over bus 22 to the appropriate peripheral circuit(s) (not shown) in the memory system 26 to be tested. The second count from the counter 14 is a binary 01 which causes the ACTB command to be read and transmitted over bus 22 to the appropriate peripheral circuit(s) (not shown) in the memory system 26 to be tested. The third count from the counter 14 is a binary 10 which causes the ACTC command to be read and transmitted over bus 22 to the appropriate peripheral circuit(s) (not shown) in the memory system 26 to be tested. The fourth count from the counter 14 is a binary 11 which causes the ACTD command to be read and transmitted over bus 22 to the appropriate peripheral circuit(s) (not shown) in the memory system 26 to be tested.

In a similar manner, the NOP (No Operation) command group 31, the DESL command group 32, the PRE (Preview) command group 33, the RD (Read) command group 34, the WR (Write) command group 35, the REFR (Reference) command group 36, and the MRS command group 37 are selectively accessed to perform the various commands associated therewith in the associated peripheral circuits (not shown) in the memory system 26 when associated commands are part of the command group.

The advantages of the present invention are that the DLL 12, Counter 14, and Programmable Look-up Table 16 are formed on a semiconductor body of the memory chip 10 instead of being located in a testing device external to the SDRAM chip 10. With such arrangement on the memory chip 10, if the frequency of the external clock signal is selectively increased or decreased, the internal clock speed from the DLL 12 on lead 19 is automatically changed to provide a new output clock signal having a programmed multiple of the newly received frequency for transmission to the peripheral circuits in the memory system 26 on the memory chip 10 requiring a clock signal. This provides an internal clock having a higher accuracy and speed than when such clock is provided by other means, such as by a remote tester. After activating a test mode, one external command via cable 21 initiates a sequence of, for example, four internal commands (e.g., the ACT command group). Since the internal clock on lead 19 is running a programmed four, eight, or sixteen times faster than the external clock, the testing speed is increased by four, eight, or sixteen, respectively. The present invention is especially useful in a Burn-in oven having, for example, a 200 nanosecond cycle time pattern since the run time can be decreased by a factor of four, eight, or sixteen depending on the multiplication factor selectively used by the DLL 12. As a result, slow and low cost testers, having a fraction of the speed of the maximum processing speed of, for example, an SDRAM chip 10, can be used to provide the addresses over cable 21 for high speed testing of a memory system 26.

It is to be appreciated and understood that the specific embodiments of the present invention described hereinabove are merely illustrative of the general principles of the invention. Various modifications may be made by those skilled in the art which are consistent with the principles set forth. For example, any suitable test command sequences can be stored in the Programmable Look-up Table 16 other than that shown in FIG. 2 and accessed in a manner described hereinabove for testing the peripheral circuits on a memory chip 10.

What is claimed is:

1. A semiconductor body comprising:
    a first portion comprising a memory system; and
    a second portion comprising a programmable clock and test command signal generator comprising:
        a programmable clock signal generator comprising a clock input terminal and an output terminal, the programmable clock signal generator being designed to generate at the output terminal thereof a clock output signal having a frequency which is a selective predetermined multiple of an external clock signal applied to the clock input terminal;
        a counter having an input coupled to the output terminal of the programmable clock signal generator and at least one output terminal, the counter being designed to generate at the at least one output terminal thereof a cyclical binary count comprising a number of counts corresponding to the multiple of the frequency of the external clock output signal generated by the programmable clock signal generator; and
        a programmable look-up memory comprising memory locations for storing separate commands useful for testing predetermined sections of the memory system, the programmable look-up memory comprising (a) at least one first input terminal coupled to receive the cyclical binary count from the counter, (b) a plurality of second input terminals coupled to receive remotely generated encoded binary address input signals which are combined with the binary count from the counter to access predetermined memory locations in the look-up memory, and (c) at least one output terminal coupled to predetermined inputs of the memory system such that testing of the memory system is accomplished at the speed of the output clock signal from the programmable clock signal generator.

2. The semiconductor body of claim 1 wherein the remotely generated encoded binary address input signals received at the plurality of second input terminals of the programmable look-up memory have a frequency which is less than the frequency of the output clock signal from the programmable clock signal generator.

3. The semiconductor body of claim 1 wherein the remotely generated encoded binary address input signals received at the plurality of second input terminals of the programmable look-up memory address a predetermined set of memory locations, and the cyclical binary count received at the at least one first input terminal of the programmable look-up memory addresses memory location of the predetermined set of memory locations associated with the address received at the plurality of second input terminals of the programmable look-up memory.

4. The semiconductor body of claim 1 wherein the programmable clock signal generator is a delayed locked loop (DLL) designed to selectively generate the output clock signal having a frequency at the selective predetermined multiple of the received external clock signal.

5. The semiconductor body of claim 1 wherein the selective multiple of frequency of the received external clock signal selectively generated by the programmable clock signal generator has a binary value of $2^n$, where $n \geq 1$.

6. The semiconductor body of claim 1 wherein the counter is responsive to the output clock signal received at the input thereof from the programmable clock signal generator for generating sequential binary counts over "n" leads to the programmable look-up memory representing a predetermined $2^n$ binary multiple of the received external clock signal generated by the programmable clock signal generator, where $n \geq 1$.

7. The semiconductor body of claim 1 wherein the programmable clock signal generator automatically alters the output clock signal at the output terminal thereof in a corresponding relationship to changes in the frequency of the external clock signal received at the clock input terminal thereof.

8. A memory chip comprising:
a first portion comprising a memory system; and
a second portion comprising a programmable clock and test command signal generator comprising:
a programmable delay locked loop (DLL) comprising a clock input terminal and an output terminal, the DLL being designed to generate at the output terminal thereof a clock output signal having a frequency which is a selective predetermined multiple of an external clock signal applied to the clock input terminal;
a counter having an input coupled to the output terminal of the DLL and at least one output terminal, the counter being designed to generate at the at least one output terminal thereof a cyclical binary count comprising a number of counts corresponding to the multiple of the frequency of the external clock output signal generated by the DLL; and
a programmable look-up memory comprising a plurality of memory locations for storing separate commands useful for testing predetermined sections of the memory system, the programmable look-up memory comprising (a) at least one first input terminal coupled to receive the cyclical binary count from the counter, (b) a plurality of second input terminals coupled to receive remotely generated encoded binary address input signals which are combined with the binary count from the counter to access predetermined memory locations in the look-up memory, and (c) at least one output terminal coupled to predetermined inputs of the memory system such that testing of the memory system is accomplished at the speed of the output clock signal from the DLL.

9. The memory chip of claim 8 wherein the multiple of the received external clock signal selectively generated by the DLL has a binary value of $2^n$, where $n \geq 1$.

10. The memory chip of claim 8 wherein the counter is responsive to the output clock signal from the DLL for generating sequential binary counts over "n" leads to the programmable look-up memory representing a predetermined $2^n$ binary multiple of the received external clock signal generated by the DLL, where $n \geq 1$.

11. The memory chip of claim 8 wherein the programmable clock signal generator automatically alters the output clock signal at the output terminal thereof in a corresponding relationship to changes in the frequency of the external clock signal received at the clock input terminal thereof.

12. A method of testing a semiconductor body having a memory system in a first portion thereof and a programmable clock and test command signal generator in a second portion thereof, the method comprising the steps of:

(a) selectively generating at an output of a programmable clock signal generator in the programmable clock and test command signal generator an output clock signal having a frequency which is a predetermined multiple of a received external clock signal at an input of the programmable clock signal generator;

(b) generating an output signal at an output of a counter comprising a cyclical binary count comprising a number of counts corresponding to the predetermined multiple of the received external clock signal selectively generated by the programmable clock signal generator in step (a) in response to the output clock signal received at an input from the programmable clock signal generator;

(c) storing separate commands for testing the memory system in a programmable look-up memory comprising a plurality of memory locations; and (d) addressing the plurality of memory locations in the programmable look-up memory with each of (1) selective external binary encoded address signals received at a plurality of first input terminals thereof where each separate binary encoded external address signal is used for accessing a separate predetermined section of the memory locations, and (2) output signal from the counter receiver at at least one second input terminals for sequentially accessing separate memory locations within the addressed separate predetermined section of memory locations at the speed of the output clock signal from the programmable clock signal generator.

13. The method of claim 12 wherein the programmable clock signal generator of step (a) is a delayed locked loop (DLL) designed to selectively generate the output clock signal at the output thereof which is a predetermined multiple of the external clock signal received at the input thereof.

14. The method of claim 12 wherein the multiple of the received external clock signal selectively generated by the programmable clock signal generator has a binary value of $2^n$, where $n \geq 1$.

15. The method of claim 12 wherein the counter in step (b) is responsive to the output clock signal from the programmable clock signal generator for generating sequential binary counts over "n" leads to the at one second input of the programmable look-up memory representing a predetermined $2^n$ binary multiple of the received external clock signal generated by the programmable clock signal generator, where $n \geq 1$.

16. The method of claim 12 wherein programmable clock signal generating device of step (a) automatically alters the output clock signal in a corresponding relationship to changes in the frequency of the received external clock signal.

* * * * *